United States Patent [19]

Noll et al.

[11] Patent Number: 4,893,264

[45] Date of Patent: Jan. 9, 1990

[54] DIGITAL DECIMATION FILTER

[75] Inventors: Tobias Noll, Neufahrn; Stefan Meier, Munich, both of Fed. Rep. of Germany

[73] Assignee: Siemens Aktiengesellschaft, Berlin and Munich, Fed. Rep. of Germany

[21] Appl. No.: 224,018

[22] Filed: Jul. 25, 1988

[30] Foreign Application Priority Data

Sep. 1, 1987 [DE] Fed. Rep. of Germany ....... 3729172

[51] Int. Cl.⁴ ............................................. G06F 15/31
[52] U.S. Cl. .............................. 364/724.1; 364/724.16
[58] Field of Search ............. 364/724.1, 724.13, 724.16

[56] References Cited

U.S. PATENT DOCUMENTS

| | | | |
|---|---|---|---|
| 4,323,980 | 4/1982 | Houdard et al. | 364/724.1 |
| 4,344,149 | 8/1982 | van de Meeberg et al. | 364/724.1 |
| 4,584,659 | 4/1986 | Stikvoort | 364/724.1 |

OTHER PUBLICATIONS

Crochiere et al, "Optimum FIR Digital Filter Implementations for Decimation, Interpolation and Narrow-Band Filtering", IEEE Trans. on Acoustics, Speech and Signal Processing, vol. ASSP-23, No. 5, Oct. 1975, pp. 444–456.

Primary Examiner—Gary V. Harkcom
Assistant Examiner—Tan V. Mai
Attorney, Agent, or Firm—Hill, Van Santen, Steadman & Simpson

[57] ABSTRACT

A digital decimation filter which includes a multiplexer which receives signal values $x_i$ at a sampling rate of $1/T$ and where output signals which have half the sampling rate are supplied to two outputs. Separate bit associated circuits BP1 and BP2 are connected to the outputs for each significant figure of the p-place binary filter coefficients c6 through c1 and each of the bit associated circuits include partial products stages $Mc6_0 \ldots Mc1_0$, $Mc6_1 \ldots Mc1_1$ for all of the filter coefficient bits and the bit associated circuits also contain adder-register iterative circuits including delay elements and the output of the iterative circuit of the most significant bit plane BP2 is the output of the filter.

3 Claims, 1 Drawing Sheet

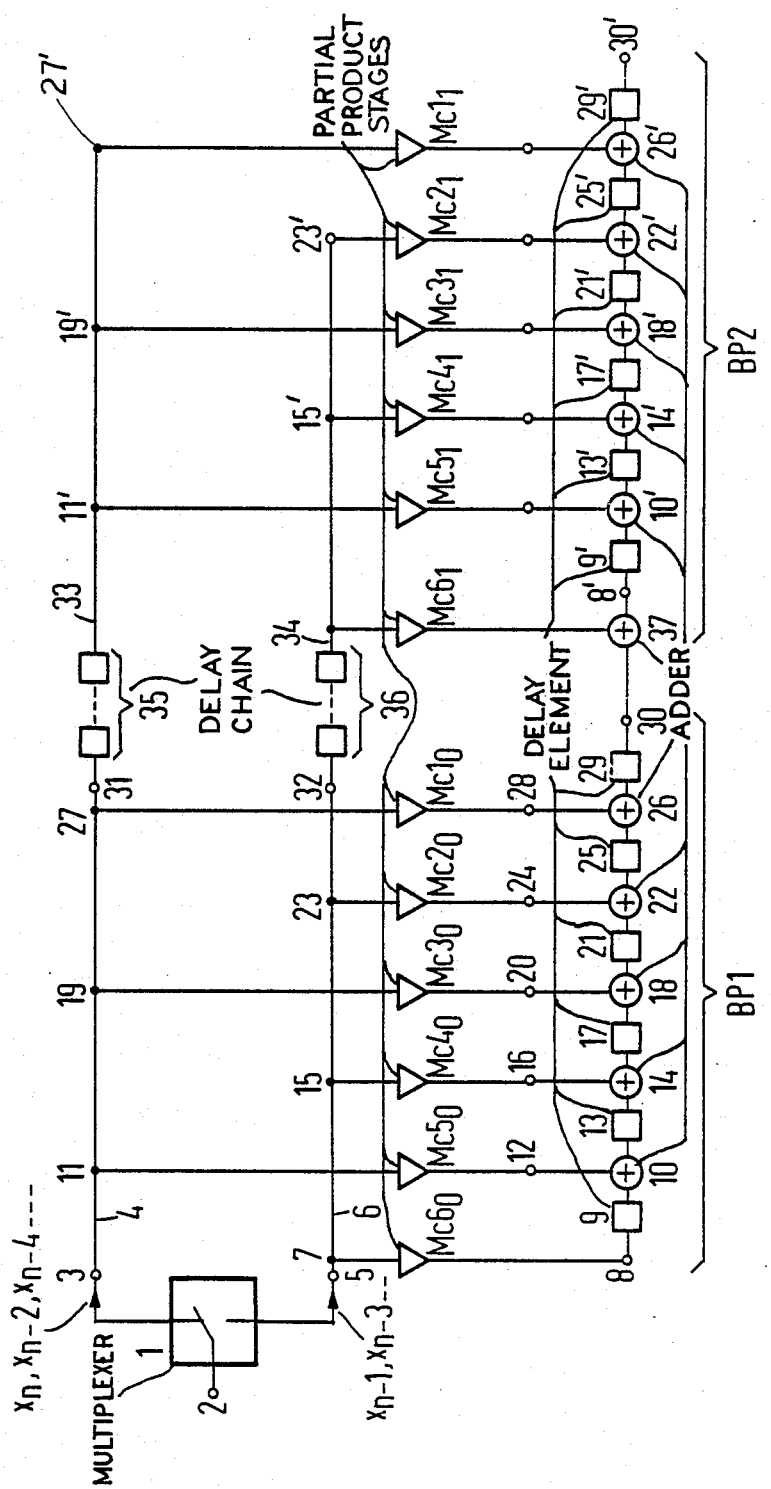

DIGITAL DECIMATION FILTER

BACKGROUND OF THE INVENTION

1. Field of the Invention

The invention relates in general to a digital decimation filter which includes a multiplexer that produces two outputs in which the first signal path receives the even-numbered signal values of an input signal supplied to the multiplexer and the second signal path receives the odd-numbered signal values from the multiplexer. Multipliers weigh the signal values with a plurality of binary filter coefficients and include first adders arranged in a first iterative circuit for adding weighted signal values and every multiplier is divided into a plurality of partial product stages corresponding in number with the number of binary filter coefficients and each of the partial product stages weights the signal based on one filter coefficient bit.

2. Description of the Prior Art

A decimation filter having fixed coefficients is described in the article "MOS Digital Filter Design" by W. Ulbrich pages 236 through 271 of the book entitled "Design of MOS VLSI Circuits for Telecommunications", edited by Y. Tsividis and P. Antognetti, Prentice-Hall, Incorporated, 1985, New Jersey of which publication is hereby incorporated by reference. Particular relevant disclosure material is included in FIGS. 9a and 10 and the description on pages 251 and 252 of a decimation filter. The known decimation filter is utilized in circuits for a digital signal processing so as to halve the sampling rate of the signals which are to be processed. The multiplexer arranged at the input of the filter is driven with a sampling rate of the digitized signal values which are supplied to it and the signal path connected to the outputs and the subcircuits of the filter connected to such signal paths are operated at half the sampling rate of the input signal.

SUMMARY OF THE INVENTION

It is an object of the present invention to provide a digital decimation filter which has programmable coefficients that are suitable for having the sampling rate of an input signal which is to be filtered and which can be integrated in a space-saving manner on a doped semiconductor body.

The advantages obtainable with the invention is that a plurality of bit associated circuits each formed of partial product stages which are required for the evaluation of the signal values according to the filter coefficient bits of a specific significance can be implemented in a space-saving manner with the associated iterative circuit and from the allocated pair of signal paths so that the transfer function of the filter can be realized on a smaller semiconductor area than is possible with prior art known decimation filters.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

The drawing is a schematic diagram illustrating a preferred exemplary embodiment of the invention.

DESCRIPTION OF THE PREFERRED EMBODIMENT

The FIG. illustrates a decimation filter according to the invention which includes a multiplexer 1 that receives at its input 2 a signal which is to be filtered. A first output of the multiplexer 1 is connected to a first signal path 4 and a second output 5 is connected to a second signal path 6. The signal paths 4 and 6 form a first pair of signal paths. An input signal x is supplied to the input 2 as a sequence of sampled discrete digitized signal values $x_i$ and are supplied at a sampling rate of $1/T$. This means that a defined signal value appears at the inputs 2 during a respective sampling period T. When, for example, a signal value $x_n$ is supplied during a sampling period $T_n$ then the signal value supplied during the proceeding sampling period $T_{n-1}$ is referenced $x_{n-1}$ and that supplied during the sampling period $T_{n-1}$ is referenced $x_{n-2}$ and so forth. The multiplexer 1 which operates with a sampling rate of $1/T$ supplies the even-numbered signal values $x_n$, $x_{n-2}$, and so forth to the signal path 4 and supplies the odd-numbered sample signals $x_{n-1}$, $x_{n-3}$ and so forth to the signal path 6 such that the sampling rate at the outputs 3 and 5 of the multiplexer are, respectively, $1/2T$.

Since the digital signal values supplied at input terminal 2 comprise word lengths of m bits, in other words, are m-placed, the input 2 and the outputs 3 and 4 each are composed of m terminals. The signal paths 4 and 6 are connected to the outputs 3 and 5 and each comprise m lines that serve the purpose of bit/parallel transmission of the signal values $x_i$.

The signal values $x_i$ are multiplied or, respectively, weighted with binary filter coefficients in a plurality of multipliers. Each of the multipliers is divided into a number of partial products stages corresponding in numbered to the place number of the binary filter coefficients and these partial product stages respectively accomplish weighting according to a coefficient bit. Assuming that six filter coefficients c1 through c6 are provided each of these having a respective word width of 2 bits whereby the least significant bit has a significance of $2^0$ and the significance of the other bits is $2^1$, two partial product stages $Mc1_1$ and $Mc1_0$ are provided for weighting with the filter coefficient c1 which is composed of the two bits $c1_1$ and $c1_0$. In an analogous manner, two partial product stages $Mc2_1$ and $Mc2_0$ are provided for the weighting with the filter coefficient c2 which is composed of the two bits $c2_1$ and $c2_0$. As is shown in the drawing, the input 7 of the partial product stage $Mc6_0$ for the least significant bit of c6 is connected to the signal path 6 and the output 8 of $Mc6_0$ is supplied as the first input to an adder 10 through a time delay element 9. The input 11 of the partial product stage $Mc5_0$ provided for weighting with $c5_0$ is connected to the signal path 4 and the output of the stage is connected to the second input of the adder 10. The output of the adder 10 is connected to the first input of an adder 14 through a time delay element 13. The input 15 of a partial product stage $Mc4_0$ is connected to the signal path 6 and the output 16 is connected to the second input of the adder 14. The output of the adder 14 is connected to the first input of an adder 18 through a time delay element 17. The input of a partial product stage $Mc3_0$ is connected to the signal path 4 and the output 20 is supplied as the second input of the adder 18. The output of the adder 18 is connected to the first input of an adder 22 through a time delay element 21. The input 23 of a partial product stage $Mc2_0$ is connected to the signal path 6 and the output 24 is connected to the second input of the adder 22. The output of the adder 22 is connected to the first input of an adder 26 through a time delay element 25. The input 27 of the partial product stage $Mc1_0$ is connected to the signal path 4 and the output is connected to the second input of the adder 26. The output of the adder 26 is connected to terminal 30 through a time delay element 29. Terminal 30 represents the output of the iterative circuit composed of the components 9, 10, 13, 14, 17, 18, 21, 22, 25, 26 and 29. Additional terminals 31 and 32 are connected to the outputs of signal paths 4 and 6 as shown.

As a consequence of the supplied m place signal values $x_i$, each of the inputs and outputs of the partial product stages $Mc6_0$ through $Mc1_0$ as described above are composed of m terminals. The plurality of inputs and outputs of the adders 10, 14, 18, 22 and 26 and the time delay elements 9, 13, 17, 21, 25 and 29 is based on the word width m. The terminals 31 and 32 each comprise m individual terminals at which the signal values $x_i$ transmitted on the signal paths 4 and 6 can be obtained in bit parallel manner. The second inputs of the adders 10, 14, 18, 22 and 26 are connected to the outputs 12, 16, 20, 24 and 28 of the partial product stages and can be referred to as free inputs since the first inputs of these adders respectively serve for the purpose of accepting the signals transmitted within the above-mentioned iterative circuit.

The described partial product stages $Mc6_0$ through $Mc1_0$, the iterative circuit lying between the circuit points 8 and 30 and the signals paths 4 and 6 represent a bit-associated circuit bit plane BP1 which is provided for multiplication of the signal values $x_i$ by the filter coefficient bits having the lowest significance $c6_0$ through $c1_0$ When the adders 10, 14, 18, 22 and 26 and the partial product stages $Mc0$ through $Mc1_0$ are each formed in a known manner as line-shaped arrangements of adder stages and gate circuits so as to implement a bit parallel signal processing then they can be integrated in an optimal space-saving manner on a doped semiconductor body. The utilization of carry-save adder stages or of carry-ripple adder stages having additional pipelining in the transmission direction of the carry signals is especially advantageous.

A second bit associated circuit BP2 which is constructed in the same manner as the first bit associated circuit BP2 contains partial product stages $Mc6$ through $Mc1_1$ so as to weight with the filter coefficient bits $c6_1$ through $c1_1$ of the next higher significance. For this purpose, signal paths 33 and 34 which form the pair of signal paths associated with bit-associated circuit BP2 are connected to the terminals 31 and 32 of the signal paths 4 and 6 through delay chains 35 and 36. Each of the delay chains 35 and 36 include a plurality of time delay elements which correspond to the number of the plurality of time delay elements in BP1 arranged between the circuit points 8 and 30. In the illustrated exemplary embodiment, thus, each of the delay chains 35 and 36 contain six time delay elements. The time delay elements 9, 13, 17, 21, 25 and 26 each cause a signal delay of one-half a clock period of the signal values appearing at the outputs 3 and 5 and this corresponds to a clock period of the signal values $x_i$ at the input 2. A signal delay which is equal is also obtained by each and every individual time delay element of the delay chains 35 and 36. This assures that the intermediate results appearing at the output 30 which are supplied by circuit BP1 and which are forwarded to BP2 are synchronized with the signal values $x_i$ transmitted from the signal paths 4 and 6 onto the signal paths 33 and 34.

The bit-associated circuit BP2 differs from the bit-associated circuits BP1 in that an additional adder 37 in which the weighted signal values output by the partial weighting stage $Mc6_1$ are added to the intermediate results that occur at circuit point 30. The output of the adder 37 is supplied to circuit point 8' which is the input of a time delay element 9' which corresponds to the time delay element 9 in the BP1. The partial product stage $Mc5_1$ receives an output from terminal point 11' which is connected to signal path 33 and supplies an input to adder 10' which also receives the output of the time delay 9'. The adder 10' supplies an output to time delay 13' which supplies an input to adder 14'. The partial product circuit $Mc4_1$ is connected to contact point 15' which is connected to signal path 34 and the partial product stage supplies an input to the adder 14'. A delay element 17' receives the output of the adder 14' and supplies an input to the adder 18'. The adder 18' also receives an input from the partial product stage $Mc3_1$ which receives an input from terminal 19' connected to signal path 33. The adder 18' supplies an output to delay element 21' which supplies an output to the adder 22' which also receives an input from partial product stage $Mc2_1$ which receives an input from terminal 23' which is connected to signal path 34. A time delay element 25' receives the output of the adder 22' and supplies an output to the adder 26' which receives an input from the partial product stage $Mc1_1$ which is connected to terminal 19' of signal path 33. A time delay 29' receives the output of adder 26' and supplies an output to the output terminal 30' of circuit BP2 which forms the output of the iterative circuit BP2 of the decimation filter. The filter output signal which has signal values that have a sampling rate which corresponds to half the sampling rate of the signal value $x_i$ at the input 2 can be taken at the output 30'.

Assuming a word width of the filter coefficients c6 through c1 of p bits each further associated bit associated circuits BP3 through BPp follow the circuit points 23', 19' and 30' and each of these bit associated circuits BP3 through BPP are provided for separate weighting with the further more significant filter coefficient bits $c6_3$ through $c1_3$ or respectively, $c6_p$ through $c1_p$. Thus, BP3 contains the partial product stages $Mc6_3$ through $Mc1_3$ and the circuit $BP_p$ comprises the stages $Mc6_p$ through $Mc1_p$. In this case, the output of the iterative circuit $BP_p$ represents the filter output.

The time delay elements such as 9, 13, 17, 21, 25 and 29 in the individual iterative circuits and the time delay elements in the delay chains, for example, 35 and 36 can be formed as closed register half stages for example, D-flipflops each of which cause a time delay of the signal values supplied to it by one-half a clock period for the signal values $x_i$ which exists at the outputs 3 and 5.

Although the invention has been described with respect to preferred embodiments, it is not to be so limited as changes and modifications may be made therein which are within the full intended scope as defined by the appended claims.

We claim as our invention:

1. A digital decimation filter comprising a multiplexer (1) which receives an input signal and which has two outputs (3, 5) respectively connected to first and second signal paths (4, 6), with said first signal path (4) receiving the even-numbered signal values of an input signal which is supplied to said multiplexer (1) at a prescribed sampling rate and said second signal path (6) receives the odd-numbered signal values, a plurality of multipliers which weight the signal values with a plurality of binary filter coefficients and alternately connected to said first and second paths, a first plurality of adders (10, 14, 18, 22, 26) connected in a first iterative circuit for adding the weighted signal values, each of said plurality of multipliers divided into a plurality of partial product stages ($Mc6_0, Mc6_1, \ldots Mc1_0, Mc1_1$) which correspond in number to the place number of the binary filter coefficients ($c6 \ldots c1$), each of said partial product stages performing a weighting based on one filter coefficient bit; said partial product stages ($Mc6_0 \ldots Mc1_0$) weighting in according to the filter coefficient bits which have the lowest significance ($c6_0 \ldots c1_0$) are connected between the signal paths (4, 6) of said first signal path and first inputs of said first plurality of adders (10, 14, 18, 22, 26), a first plurality of time delay elements (13, 17, 21, 25) connected between individual ones of said first plurality of adders; and a first delay element (9) is switched between a first adder (10) and a first partial stage ($mc6_0$), third and fourth signal paths (33, 34) provided for each, further filter coefficient bit ($c6_1 \ldots c1$) which has a higher significance, said third and fourth signal paths respectively, connected to said first and second signal paths (4, 6) through first and second delay chains (35, 36); an additional iterative circuit ($8' \ldots 30'$) including a further plurality of adders ($10', 14', 18', 22', 26'$) for each of the further filter coefficient bits ($c6_1 \ldots c1_1$) and for each of said further filter coefficient bits ($c6_1 \ldots c1_1$), additional plurality of partial product stages ($Mc6_1 \ldots Mc1_1$) are provided which weigh according to the filter coefficient bits are connected between said third and fourth signal paths (33, 34) and said further plurality of adders (10, 14', 18', 22', 26') connected, respectively, to the outputs of said additional plurality of partial product stages, a further plurality of time delay elements ($13', 17', 21', 25'$) respectively connected to said further plurality of adders; and a second delay element ($9'$) is switched between a second adder (37) and a third adder (37) and said second adder (37) is connected to receive the output of a second partial product stage ($Mc6_1$) and the output of the proceeding chain circuit (8–30); and the output ($30'$) of said additional iterative circuit ($8' \ldots 30'$) corresponding to the filter coefficient bit which has the highest significance.

2. A digital decimation filter comprising a multiplexer which receives an input signal and samples it at a 1/T rate, a first signal path which receives output signals $x_n$, $x_{n-2}$ from said multiplexer which are sampled at a 1/2T rate, a second signal path which receives output signals $x_{n-1}, x_{n-3} \ldots$ from said multiplexer, first, third, and fifth partial product stages connected to said second signal path, a first time delay connected to the output of said first partial product stage, second, fourth and sixth partial product stages connected to said first signal path, a first adder connected to receive inputs from said first time delay and said second partial product stage, a second time delay receiving the output of said first adder, a second adder receiving inputs from said second time delay and said third partial product stage, a third time delay receiving the output of said second adder, a third adder receiving inputs from said third time delay and said fourth partial product stage, a fourth time delay receiving the output of said third adder, a fourth adder receiving inputs from said fourth time delay and said fifth partial product stage, a fifth time delay receiving the output of said fourth adder, a fifth adder receiving inputs from said fifth time delay and said sixth partial product stage, and a sixth time delay receiving the output of said fifth adder.

3. A digital decimation filter according to claim 2, third and fourth signal paths, first and second chain delay elements (35, 36) connected between said third and fourth signal paths and said first and second signal paths, seventh, ninth and eleventh partial product stages connected to said third signal path, eighth, tenth and twelfth partial product stages connected to said fourth signal path, a sixth adder connected to receive inputs from said eighth partial product stage and from said sixth time delay, a seventh time delay receiving the output of said sixth adder, a seventh adder receiving the outputs of said seventh partial product stage and said seventh time delay, an eighth time delay receiving the output of said seventh adder, an eighth adder receiving the outputs of said tenth partial product stage and said eighth time delay, a ninth time delay receiving the output of said eighth adder, a ninth adder receiving the outputs of said ninth partial product stage and said ninth time delay, a tenth time delay receiving the output of said ninth adder, a tenth adder receiving the outputs of said twelfth partial product stage and said tenth time delay, an eleventh time delay receiving the output of said tenth adder, and an eleventh adder which receives the output of said eleventh partial product stage and said element time delay.

* * * * *